(12) United States Patent
Liao

(10) Patent No.: US 7,697,289 B1
(45) Date of Patent: Apr. 13, 2010

(54) AUXILIARY HEAT DISSIPATION DEVICE FOR LIQUID CRYSTAL DISPLAY

(76) Inventor: Chun-Chi Liao, 6F, No. 15-2, Lane 420, Sec. 5, Cheng-Gong Road, Jin-Hu-Li, Nei-Hu, Taipei (TW)

( * ) Notice: Subject to any disclaimer, the term of this patent is extended or adjusted under 35 U.S.C. 154(b) by 0 days.

(21) Appl. No.: 12/327,445

(22) Filed: Dec. 3, 2008

(51) Int. Cl.
*H05K 7/20* (2006.01)

(52) U.S. Cl. .................. 361/695; 361/690; 361/694; 345/905

(58) Field of Classification Search .............. None
See application file for complete search history.

(56) References Cited

U.S. PATENT DOCUMENTS

| | | | |
|---|---|---|---|
| 6,198,222 B1* | 3/2001 | Chang | 313/582 |
| 7,190,578 B2* | 3/2007 | Bang et al. | 361/694 |
| 7,522,416 B2* | 4/2009 | Kim et al. | 361/695 |
| 7,593,226 B2* | 9/2009 | Yamanaka | 361/695 |
| 2007/0171613 A1* | 7/2007 | McMahan et al. | 361/695 |
| 2009/0174626 A1* | 7/2009 | Isoshima et al. | 345/55 |

* cited by examiner

*Primary Examiner*—Boris L Chervinsky
(74) *Attorney, Agent, or Firm*—Birch, Stewart, Kolasch & Birch, LLP

(57) ABSTRACT

An auxiliary heat dissipation device for a liquid crystal display includes a housing having an internal space for receiving a liquid crystal display module, and a cover plate assembled to cover a front of the housing. The housing has a plurality of air inlets at a bottom thereof and a plurality of air outlets at a top thereof. A plurality of discharge fans each is mounted at the corresponding air outlet in the housing. A plurality of intake fans each is mounted at the corresponding air inlet in the housing, wherein a central axis of each of the intake fans keeps an appropriate included angle with respect to a central axis of the corresponding air inlet, so as to be able to efficiently dissipate the heat generated from the liquid crystal display module to the outside of the housing.

2 Claims, 4 Drawing Sheets

AUXILIARY HEAT DISSIPATION DEVICE FOR LIQUID CRYSTAL DISPLAY

BACKGROUND OF THE INVENTION

1. Field of the Invention

The present invention relates to an auxiliary heat dissipation device which can be used to receive a liquid crystal display therein and can efficiently dissipate out the heat generated from the liquid crystal display.

2. The Prior Arts

Due to the advantages of having a small, thin and lightweight structure, a small space occupation, and an increasing technology maturity, LCD TVs are being increasingly popularized. Most users tend to directly place the LCD TV on a TV stand or other furniture, or mount it on a wall. Although the LCD TV may affect the overall home decoration, it is more convenient for the users to operate and watch the LCD TV.

In order not to affect the overall home decoration, some people mount the LCD TV inside a wall in such a way that the LCD TV can be rotated, or moved horizontally or vertically, to a preset place from the inside of the wall by means of a drive mechanism.

Another placement way of the LCD TV is to assemble the LCD TV inside a cabinet. The cabinet can be placed at a proper location in the home and also used as a table or a stand. The LCD TV can be exposed out of the cabinet when the LCD TV is in use state.

No matter what the LCD TV is mounted inside a decorative wall or in a cabinet, it generally has bad heat dissipation effectiveness that may reduce the life span of the LCD TV.

SUMMARY OF THE INVENTION

A primary objective of the present invention is to provide an auxiliary heat dissipation device for a liquid crystal display that is mounted in a wall or in a cabinet. The auxiliary heat dissipation device can efficiently dissipate out the heat generated from the liquid crystal display.

In order to achieve the aforementioned objective, in accordance with the present invention, an auxiliary heat dissipation device for a liquid crystal display includes a housing having an internal space for receiving a liquid crystal display module. A cover plate is assembled to cover a front of the housing and the cover plate has a window facing a display surface of the liquid crystal display module. The housing has a plurality of air inlets at a bottom thereof and a plurality of air outlets at a top thereof. A plurality of discharge fans each is mounted at the corresponding air outlet in the housing. A plurality of intake fans each is mounted at the corresponding air inlet in the housing, wherein a central axis of each of the intake fans keeps an appropriate included angle with respect to a central axis of the corresponding air inlet, so as to be able to efficiently dissipate the heat generated from the liquid crystal display module to the outside of the housing and thereby to prolong the life span of the liquid crystal display.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENTS

Figure 1:
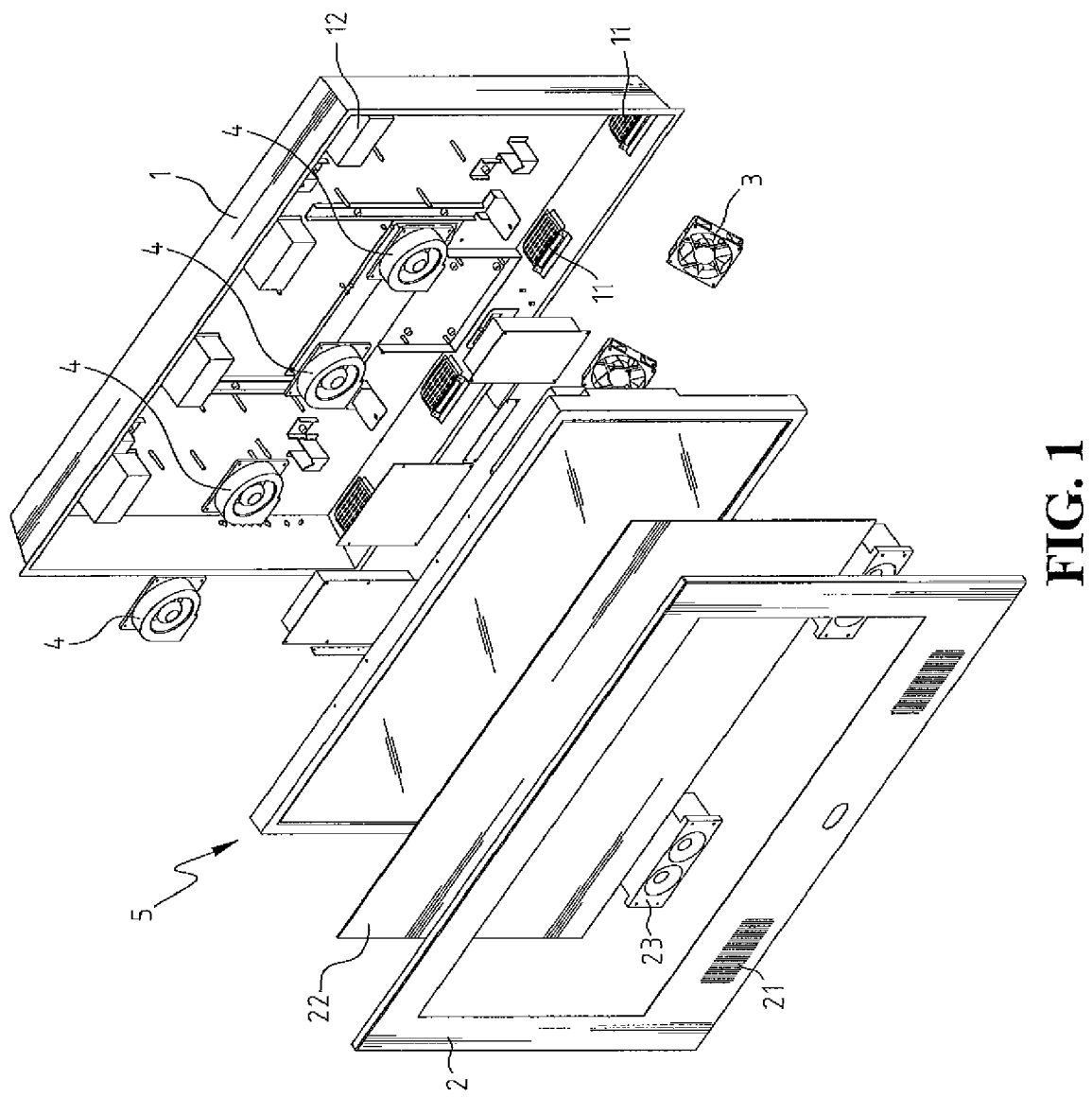
FIG. 1 is a perspective exploded view of an auxiliary heat dissipation device for a liquid crystal display in accordance with an embodiment of the present invention.
Figure 2:
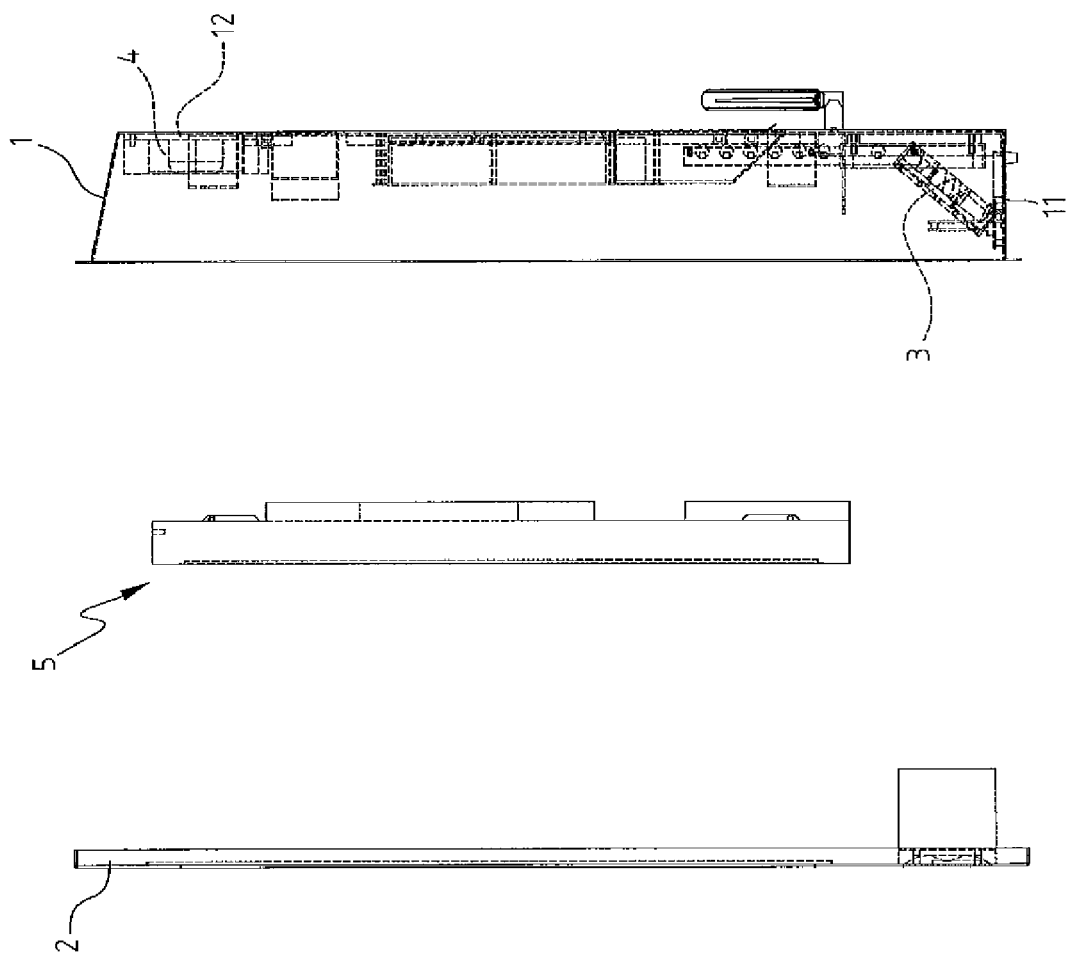
FIG. 2 is an exploded top view of the auxiliary heat dissipation device for the liquid crystal display of FIG. 1.
Figure 3:
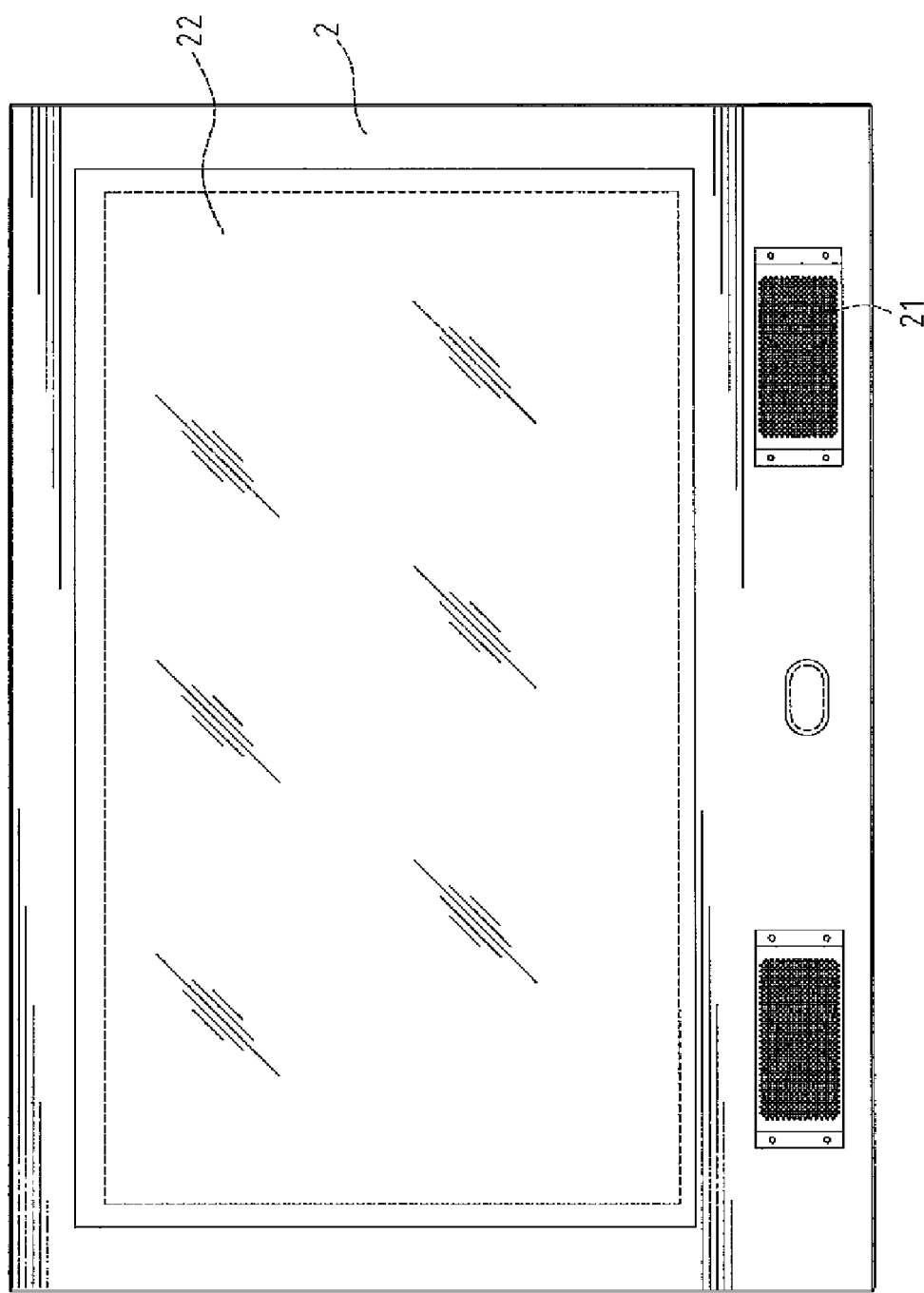
FIG. 3 is a front view of the auxiliary heat dissipation device of FIG. 1.
Figure 4:
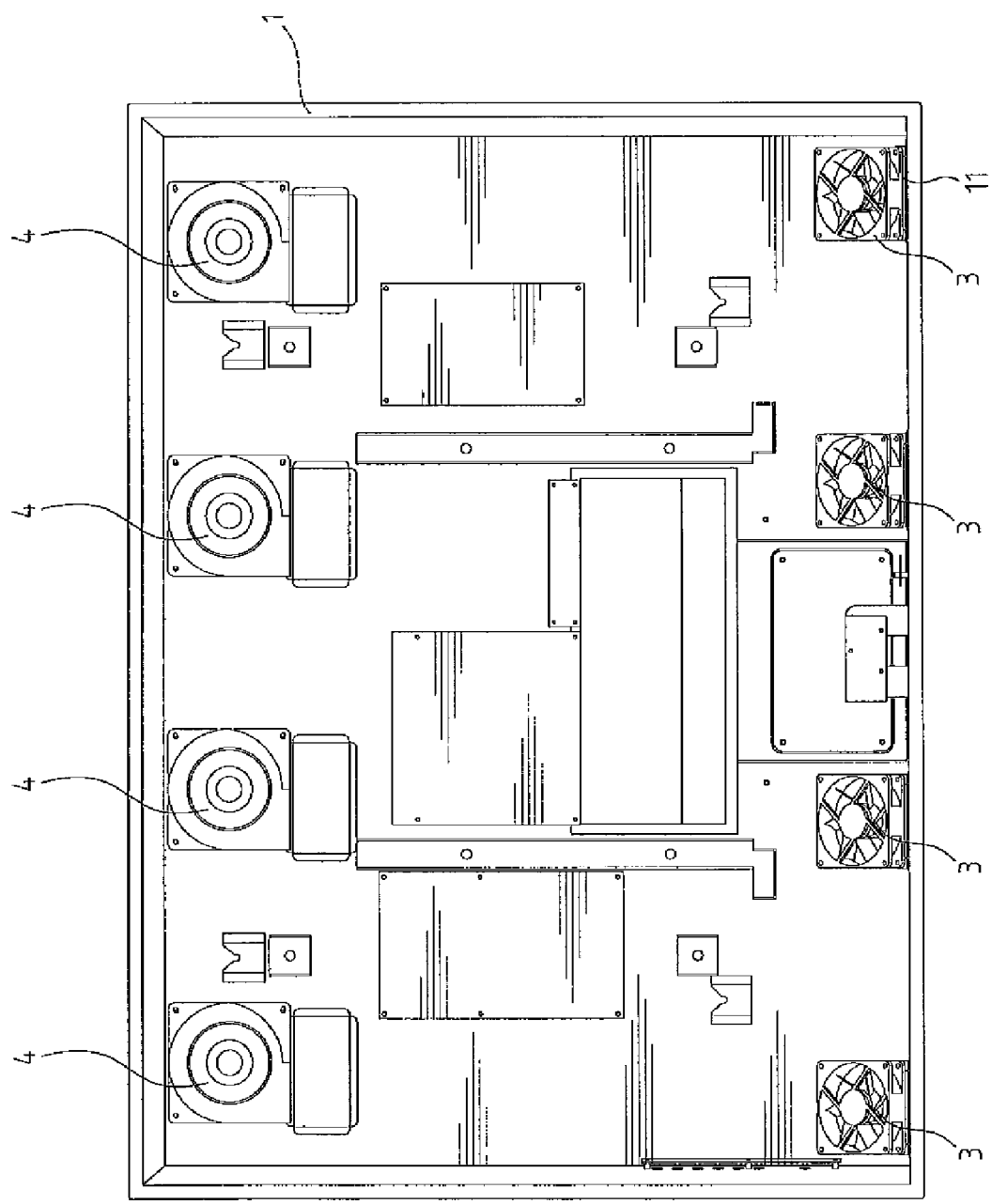
FIG. 4 is a rear view of the auxiliary heat dissipation device of FIG. 1.

Referring to FIGS. 1-4, an auxiliary heat dissipation device for a liquid crystal display in accordance with an embodiment of the present invention includes a housing 1, a cover plate 2 with a window defined in a center thereof, a plurality of intake fans 3, and a plurality of discharge fans 4. The housing 1 has an internal space for receiving a liquid crystal display module 5 therein. The housing 1 has a plurality of air inlets 11 defined at a bottom (a horizontal plane) thereof, and a plurality of air outlets 12 defined at a top of a vertical plane. In addition, an interior of the housing 1 can receive electronic elements or devices associated with the liquid crystal display module 5.

The intake fans 3 may be of any type of fan and are of an axial fan in the embodiment of the present invention. Each of the intake fans 3 is mounted at the corresponding air inlet 11 in the housing 1. A central axis of each of the intake fans 3 keeps an included angle of between 10°~75° with respect to a central axis of the corresponding air inlet 11. In order to achieve a better air intake, the included angle is preferably 45°.

The discharge fans 4 may also be of any type of fan and are of an axial fan in the embodiment of the present invention. Each of the discharge fans 4 is mounted at the corresponding air outlet 12 in the housing 1. A central axis of each of the discharge fans 4 is in parallel to a central axis of the corresponding air outlet 12. In assembling, the intake fans 3 and the discharge fans 4 are well-mounted in the housing 1, and then the liquid crystal display module 5 is received in the internal space of the housing 1. A window plate 22 is mounted behind the cover plate 2 and corresponds to the window of the cover plate 2, and subsequently the cover plate 2 mounted with the window plate 22 is assembled to cover a front of the housing 1. The window plate 22 is positioned to face a display surface of the liquid crystal display module 5. The window plate 22 typically made of glass material or transparent material is used for protecting the liquid crystal display module 5. Speaker sound holes 21 are formed in a bottom of the cover plate 2 and speakers 23 each is mounted behind the corresponding speaker sound hole 21. The speakers 23 are electrically connected to the liquid crystal display module 5 to thereby produce sound in response to sound signals emitted from the liquid crystal display module 5.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. An auxiliary heat dissipation device for a liquid crystal display, comprising:
    a housing having an internal space for receiving a liquid crystal display module, the housing having a plurality of air inlets at a bottom thereof and a plurality of air outlets at a top thereof;
    a plurality of intake fans each mounted at the corresponding air inlet in the housing, wherein a central axis of each of the intake fans keeps an included angle with respect to a central axis of the corresponding air inlet;
    a plurality of discharge fans each mounted at the corresponding air outlet in the housing; and
    a cover plate assembled to cover a front of the housing and having a window facing a display surface of the liquid crystal display module.

2. The auxiliary heat dissipation device for the liquid crystal display as claimed in claim 1, wherein the included angle is between 10°~75°.

* * * * *